US011722147B2

United States Patent
Cedola et al.

(10) Patent No.: US 11,722,147 B2
(45) Date of Patent: *Aug. 8, 2023

(54) DYNAMIC SEQUENCING OF DATA PARTITIONS FOR OPTIMIZING MEMORY UTILIZATION AND PERFORMANCE OF NEURAL NETWORKS

(71) Applicant: Microsoft Technology Licensing, LLC, Redmond, WA (US)

(72) Inventors: Kent D. Cedola, Bellevue, WA (US); Larry Marvin Wall, Seattle, WA (US); Boris Bobrov, Kirkland, WA (US); George Petre, Redmond, WA (US); Chad Balling McBride, North Bend, WA (US); Amol Ashok Ambardekar, Redmond, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/583,499

(22) Filed: Jan. 25, 2022

(65) Prior Publication Data

US 2022/0147833 A1 May 12, 2022

Related U.S. Application Data

(63) Continuation of application No. 15/719,351, filed on Sep. 28, 2017, now Pat. No. 11,256,976.
(Continued)

(51) Int. Cl.
*H03M 7/30* (2006.01)
*G06N 3/04* (2023.01)
(Continued)

(52) U.S. Cl.
CPC .......... *H03M 7/3059* (2013.01); *G06F 1/324* (2013.01); *G06F 1/3275* (2013.01);
(Continued)

(58) Field of Classification Search
None
See application file for complete search history.

(56) References Cited

U.S. PATENT DOCUMENTS

2016/0179434 A1 6/2016 Herrero Abellanas et al.
2016/0292040 A1 10/2016 Kumarasamy
(Continued)

FOREIGN PATENT DOCUMENTS

| CN | 101946249 A | 1/2011 |
|---|---|---|
| CN | 106104512 A | 11/2016 |

OTHER PUBLICATIONS

"Office Action Issued in European Patent Application No. 18725024.6", dated Jan. 17, 2022, 11 Pages.
(Continued)

*Primary Examiner* — Daniel C Puentes
(74) *Attorney, Agent, or Firm* — Newport IP, LLC; Han K. Gim

(57) ABSTRACT

Optimized memory usage and management is crucial to the overall performance of a neural network (NN) or deep neural network (DNN) computing environment. Using various characteristics of the input data dimension, an apportionment sequence is calculated for the input data to be processed by the NN or DNN that optimizes the efficient use of the local and external memory components. The apportionment sequence can describe how to parcel the input data (and its associated processing parameters—e.g., processing weights) into one or more portions as well as how such portions of input data (and its associated processing parameters) are passed between the local memory, external
(Continued)

memory, and processing unit components of the NN or DNN. Additionally, the apportionment sequence can include instructions to store generated output data in the local and/or external memory components so as to optimize the efficient use of the local and/or external memory components.

20 Claims, 10 Drawing Sheets

Related U.S. Application Data

(60) Provisional application No. 62/486,432, filed on Apr. 17, 2017.

(51) Int. Cl.
| | | |
|---|---|---|
| *G06N 3/063* | (2023.01) | |
| *G06F 12/0862* | (2016.01) | |
| *G06F 9/46* | (2006.01) | |
| *G06F 1/324* | (2019.01) | |
| *G06F 3/06* | (2006.01) | |
| *G06F 9/38* | (2018.01) | |
| *G06F 12/08* | (2016.01) | |
| *G06F 12/10* | (2016.01) | |
| *G06F 15/80* | (2006.01) | |
| *G06F 17/15* | (2006.01) | |
| *G06N 3/049* | (2023.01) | |
| *G06N 3/06* | (2006.01) | |
| *G06N 3/08* | (2023.01) | |
| *G06N 3/10* | (2006.01) | |
| *H04L 45/02* | (2022.01) | |
| *H04L 67/02* | (2022.01) | |
| *G06F 9/30* | (2018.01) | |
| *H04L 67/1001* | (2022.01) | |
| *G06F 9/48* | (2006.01) | |
| *G06F 12/02* | (2006.01) | |
| *G06N 3/045* | (2023.01) | |
| *G06N 3/065* | (2023.01) | |
| *G06F 13/16* | (2006.01) | |
| *G06F 1/3234* | (2019.01) | |
| *G06F 13/28* | (2006.01) | |
| *H03M 7/46* | (2006.01) | |
| *H04L 45/50* | (2022.01) | |

(52) U.S. Cl.
CPC .......... *G06F 3/0604* (2013.01); *G06F 3/067* (2013.01); *G06F 3/0631* (2013.01); *G06F 9/30087* (2013.01); *G06F 9/3836* (2013.01); *G06F 9/3887* (2013.01); *G06F 9/46* (2013.01); *G06F 9/4881* (2013.01); *G06F 12/0207* (2013.01); *G06F 12/0238* (2013.01); *G06F 12/08* (2013.01); *G06F 12/0862* (2013.01); *G06F 12/10* (2013.01); *G06F 13/1673* (2013.01); *G06F 13/1689* (2013.01); *G06F 13/28* (2013.01); *G06F 15/8007* (2013.01); *G06F 17/15* (2013.01); *G06N 3/04* (2013.01); *G06N 3/045* (2023.01); *G06N 3/049* (2013.01); *G06N 3/06* (2013.01); *G06N 3/063* (2013.01); *G06N 3/065* (2023.01); *G06N 3/08* (2013.01); *G06N 3/10* (2013.01); *H03M 7/6005* (2013.01); *H03M 7/6011* (2013.01); *H03M 7/70* (2013.01); *H04L 45/04* (2013.01); *H04L 67/02* (2013.01); *H04L 67/1001* (2022.05); *G06F 2209/484* (2013.01); *G06F 2209/485* (2013.01); *G06F 2212/657* (2013.01); *H03M 7/46* (2013.01); *H04L 45/50* (2013.01); *Y02D 10/00* (2018.01)

(56) References Cited

U.S. PATENT DOCUMENTS

2016/0335119 A1* 11/2016 Merrill .................. G06N 3/063
2021/0073169 A1* 3/2021 Wang .................... G06F 9/4881

OTHER PUBLICATIONS

Judd, et al., "Proteus: Exploiting Numerical Precision Variability in Deep Neural Networks", In Proceedings of the International Conference on Supercomputing, Jun. 1, 2016, 12 Pages.
"Office Action Issued in Indian Patent Application No. 201947035672", dated Feb. 3, 2022, 7 Pages.
"First Office Action and Search Report Issued in Chinese Patent Application No. 201880025417.X", dated Sep. 1, 2022, 7 Pages.
"Second Office Action Issued in Chinese Patent Application No. 201880025417.X", dated Feb. 25, 2023, 6 Pages.
"Notice of Allowance Issued in Chinese Patent Application No. 201880025417.X", dated May 18, 2023, 4 Pages.

* cited by examiner

DYNAMIC SEQUENCING OF DATA PARTITIONS FOR OPTIMIZING MEMORY UTILIZATION AND PERFORMANCE OF NEURAL NETWORKS

RELATED APPLICATIONS

This application is a continuation of U.S. patent application Ser. No. 15/719,351, filed Sep. 28, 2017, which claims priority to U.S. Provisional Patent Application No. 62/486,432, filed on Apr. 17, 2017, and titled "Enhanced Neural Network Designs," the entire disclosure of which are incorporated in their entirety by reference herein.

BACKGROUND

Neural network (NN) or deep neural network (DNN) processing typically requires that runtime occurs over multiple layers of the network where activations are computed at each layer. The output of the first layer acts as the input of the subsequent layer. For example, the processed activations of a first NN/DNN layer act as inputs to a second NN/DNN layer. The processed activations of a second layer then act as input to a third layer. The processed activations continue to occur until reaching the last layer of the network where the output of the last layer is used by the NN/DNN computing environment for presentation or storage.

Currently deployed NN/DNN computing environments, having limited resources such as local memory (i.e. local caches), typically store intermediate layer activations to a main memory. Operatively, data being processed is transferred from the local memory/processing unit(s) to the main memory and then back to the local memory/processing unit(s), i.e., when the data is needed for processing the next layer. Such a practice is generally inefficient and requires undergoing avoidable processing cycles as well as the use of critical memory management resources, contributing to latency and stressed performance of the NN/DNN computing environment.

Moreover, NNN/DNN computing environments that use a small local memory as a staging area for its inputs/activations and weights can be inefficient since all intermediate activations are generally stored to the main memory. For example, if the size of the inputs and weights for a given layer is larger than the size of the local memory, the outputs of the current layer cannot be stored to the local memory without overwriting the inputs and weights being processed. Operatively, the outputs of this given layer will need to be stored to the main memory. If the next layer in the network is a layer that consumes this data (as most of the time is the case), then the system is utilizing double the bandwidth by storing the data to the main memory and then copying it back to the local staging memory for required processing by the next layer of the network.

A more advantageous NN/DNN architecture/data management scheme would maximize the use of local data (i.e., local to the processing unit(s)) and minimize data read/writes to the main memory, which would result in a net benefit in terms of processing speed and power consumption.

It is with respect to these considerations and others that the disclosure made herein is presented.

SUMMARY

Techniques described herein provide for the use of a "depth first" and/or a dynamic "depth first" approach to data processing utilized in an exemplary neural network (NN) and/or Deep Neural Network (DNN) environment, wherein the "depth first" and/or "dynamic depth first" processing protocol (e.g., expressed as one or more instructions provided by a controller component of the exemplary NN and/or DNN environment) operatively calculates and executes a data apportionment sequence that allows for the processing of data that improves overall performance and optimizes memory management. In other illustrative implementations, the data apportionment sequence can be calculated by other cooperative components of the exemplary neural network (NN) and/or Deep Neural Network (DNN) environment including but not limited to online or offline compilers and other associated components.

In an illustrative implementation, an exemplary DNN environment can comprise one or more processing blocks (e.g., computer processing units—CPUs), a memory controller, a high bandwidth fabric (e.g., data bus passing data and/or data elements between an exemplary DNN module and the cooperating components of a DNN environment), an operation controller, and a DNN module. In the illustrative implementation, the exemplary DNN module can comprise an exemplary DNN state controller, a descriptor list controller (DLC), dMA (DDMA), DMA Streaming Activations (DSA), an operation controller, a load controller, and a store controller.

In an illustrative operation, the operational controller of the NN/DNN environment can operatively process large amounts of data in order to apply one or more desired data processing operations (e.g., convolution, max pooling, scalar multiply/add, summation, fully connected, etc.). In the illustrative operation, a participating user can specify the dimensions of the data being processed by the NN/DNN environment. Illustratively, using the data dimensions, the number of available processing layers in the NN/DNN environment, as well as data representative of one or more characteristics of cooperating memory components of the NN/DNN environment (e.g., memory size, location, latency, efficiency, etc.), a data apportionment sequence can be calculated by the NN/DNN environment components that specifies that input data for each layer is to be apportioned (as well as any associated processing parameters) and communicated between the cooperating NN/DNN memory components and NN/DNN processors to achieve optimal processing.

In an illustrative implementation, the exemplary NN/DD environment can include a local memory component and an external memory component. In this implementation, the local memory components operatively transfer data at higher rates with reduced latency relative to the external memory component. Operatively, the local memory component can include a memory size to store smaller amounts of data relative to the external memory component.

In an illustrative operation, input data (e.g., a data blob) can be received for processing by the NN/DNN environment having a specific defined data dimension, associated data processing parameters (e.g., layer weights), a defined number of processing layers required for processing, as well as data representative of one or more characteristics of the cooperating memory components of the NN/DNN environment. Operatively, the operational controller provides instructions to calculate a data apportionment sequence using the received data dimensions, cooperating memory characteristics, and number of layers. The calculated data apportionment sequence generates data representative of the number of portions to parcel the input data across each of the available processing layers and the timing of loading of the portions of data (and their associated processing parameters) from an external memory component, to an internal memory component, to an available processing unit of the NN/DNN environment.

Additionally, the calculated data apportionment sequence can include instructions for the operational controller to communicate the data portion(s) from the external memory to the local memory to the available processing unit(s) according to a calculated sequence. Illustratively, the local memory component can be utilized in the processing sequence to store output data for processed portions of data for each of the processing layers. In the illustrative operation, upon processing all of the portions of a given processing layer and storing such output portion data in a local memory, the cooperating processing units can assemble the generated output portion data for the given processing layer (stored in the local memory) to generate complete output data for the given processing layer. In an illustrative operation, the generated complete layer output data can then be stored in the external memory component that results in making more of the local memory component's memory available for subsequent layer processing.

The techniques presented herein provide advantageous NN/DNN architecture/data management schemes that can maximize the use of local data (i.e., local to the processing unit(s)) and minimize data read/writes to the main memory, which result in a net benefit in terms of processing speed and power consumption.

It should be appreciated that, although described in relation to a system, the above-described subject matter may also be implemented as a computer-controlled apparatus, a computer process, a computing system, or as an article of manufacture such as a computer-readable medium and/or dedicated chipset. These and various other features will be apparent from a reading of the following Detailed Description and a review of the associated drawings. This Summary is provided to introduce a selection of concepts in a simplified form that are further described below in the Detailed Description.

This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DRAWINGS

The Detailed Description is described with reference to the accompanying figures. In the figures, the left-most digit(s) of a reference number identifies the figure in which the reference number first appears. The same reference numbers in different figures indicate similar or identical items. References made to individual items of a plurality of items can use a reference number with a letter of a sequence of letters to refer to each individual item. Generic references to the items may use the specific reference number without the sequence of letters.

DETAILED DESCRIPTION

Figure 1:
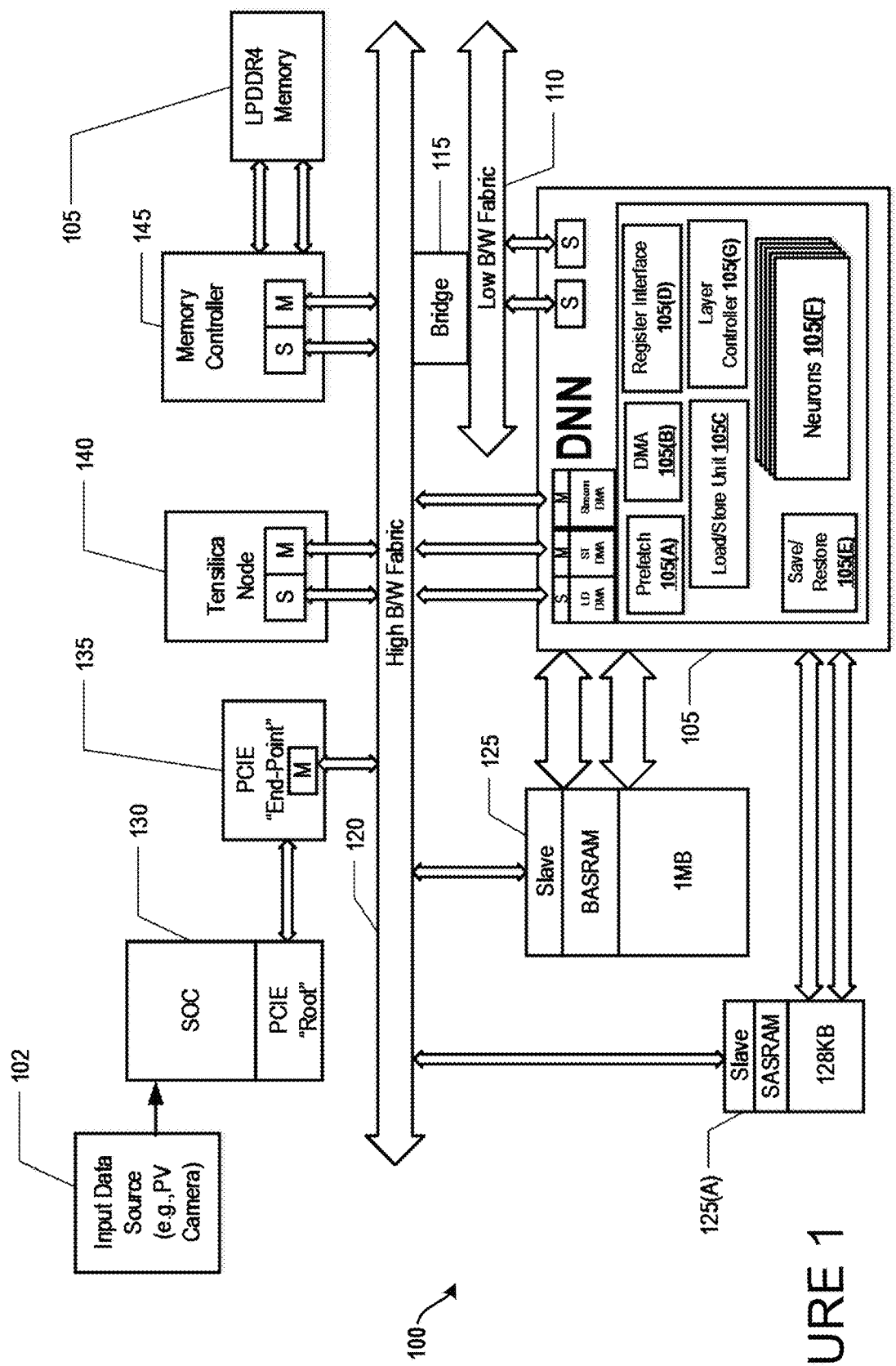
FIG. 1 illustrates a block diagram of an exemplary neural network environment in accordance with the herein described systems and methods.

The following Detailed Description describes techniques that provide for the optimization of processing and memory resources utilized in an exemplary neural network (NN) and/or Deep Neural Network (DNN) environment. In general, the iterators (e.g., expressed as iterator controller components of the exemplary NN and/or DNN environment) operatively allow for the processing of data that improves overall performance and optimizes memory management. In an illustrative implementation, an exemplary DNN environment can comprise one or more processing blocks (e.g., computer processing units—CPUs), a memory controller, a high bandwidth fabric (e.g., data bus passing data and/or data elements between an exemplary DNN module and the cooperating components of a DNN environment), iterator controller, operation controller, and a DNN module. In the illustrative implementation, the exemplary DNN module can comprise an exemplary DNN state controller, a descriptor list controller (DLC), dMA (DDMA), DMA Streaming Activations (DSA), operation controller, load controller, and store controller.

In an illustrative operation, the operational controller of the NN/DNN environment can operatively process large amounts of data in order to apply one or more desired data processing operations (e.g., convolution, max pooling, scalar multiply add, summation, fully connected, etc.). In the illustrative operation, a participating user can specify the dimensions of the data being processed as well as the configuration data processing by the NN/DNN environment. Such data can include the number of processing layers available for processing data in the NN/DNN environment as well as one or more operational characteristics of the cooperating memory components of the NN/DNN environment.

In an illustrative implementation, data to be processed by the NN/DNN environment can be represented as a blob. Generally, a blob represents the data in memory that needs to be processed. Each blob can maintain a logical mapped shape defined by various dimensions such as width, height, number of channels, number of kernels, and other available dimensional units. In an illustrative operation, the components of the NN/DNN can traverse across a multi-dimensional blob (e.g., as defined by a logical data mapping) or a smaller N dimensional slice of such a blob, where N is the number of dimensions (e.g., for a 3D blob representing an image with width, height and number of channels—N=3). While traversing the blob, one or more instructions can be generated by one or more cooperating components of the NN/DNN including, but not limited to, load instructions for loading data from the source memory to the processing unit(s) (e.g., neuron processors), or store instructions for storing data produced by the processing unit(s) to a destination memory (e.g., cooperating memory component of the NN/DNN environment—local or external memory). In the illustrative operation, the operational controller is capable of producing instructions that read/write multiple data concurrently.

Generally, in processing data in a Neural Network (NN), there can be multiple processing layers at runtime wherein the activations at each layer can be computed and then communicated as an input to a subsequent layer, until reaching the last layer of the network. When implementing systems with limited resources such as local memory (e.g., local caches), there can exist a need to store the intermediate layer activations to a cooperating larger memory component (e.g., main memory, external memory). Currently, such data transfers consume avoidable processing as data transfers from the local memory/processing unit(s) to the main memory and then back to the local memory/processing unit(s) will occur when the data is needed for processing by the next layer.

The herein described systems and methods provide a mechanism through which the use of local data (i.e., data local to the processing unit(s) and stored on a local memory component) is optimized and the data transfers that are required to occur to/from the main memory are minimized. This can result in a net benefit in terms of increasing processing speed and reducing power consumption.

Typically, NN/DNN are operative to perform the processing execution of each complete layer before processing the next layer in the network. Moreover, typically, intermediate layer activations (i.e., intermediate layer generated output data) are generally stored in a main memory until consumed by the next processing layer.

In an illustrative implementation, an apportionment sequence can be calculated that parcels the input data into processing portions across the available processing layers that includes instructions to store intermediate activations in a cooperating local memory component and store complete output data in a cooperating main memory component. The apportionment sequence can be calculated using the input data dimensions, data representative of the operational characteristics of the cooperating memory components (e.g., size, speed, location of the memory components, etc.), number of neuron processors available for processing data, clock speed of the processing units, as well as the number of available processing layers in the NN/DD environment. Illustratively, the calculated apportionment sequence provides a specific sequence of which portions of data (and associated processing parameters—e.g., layer weight data) to process on a step by step basis, as well as where to load and/or store the data (i.e., local memory component or main memory component) on a step by step basis.

Techniques described herein provide for the use of a "depth first" and/or a dynamic "depth first" approach to data processing utilized in an exemplary neural network (NN) and/or Deep Neural Network (DNN) environment, wherein the "depth first" and/or "dynamic depth first" processing protocol (e.g., expressed as one or more instructions provided by a controller component of the exemplary NN and/or DNN environment) operatively calculates and executes a data apportionment sequence that allows for the processing of data that improves overall performance and optimizes memory management. In other illustrative implementations, the data apportionment sequence can be calculated by other cooperative components of the exemplary neural network (NN) and/or Deep Neural Network (DNN) environment including but not limited to online or offline compilers and other associated components.

In an illustrative implementation, an exemplary DNN environment can comprise one or more processing blocks (e.g., computer processing units—CPUs), a memory controller, a high bandwidth fabric (e.g., data bus passing data and/or data elements between an exemplary DNN module and the cooperating components of a DNN environment), operation controller, and a DNN module. In the illustrative implementation, the exemplary DNN module can comprise an exemplary DNN state controller, a descriptor list controller (DLC), dMA (DDMA), DMA Streaming Activations (DSA), operation controller, load controller, and store controller.

In an illustrative operation, the operational controller of the NN/DNN environment can operatively process large amounts of data in order to apply one or more desired data processing operations (e.g., convolution, max pooling, scalar multiply/add, summation, fully connected, etc.). A participating user can specify the dimensions of the data being processed by the NN/DNN environment. Then, using the specified data dimensions, as well as the number of available processing layers in the NN/DNN environment, and data representative of one or more characteristics of cooperating memory components of the NN/DNN environment (e.g., memory size, location, latency, efficiency, etc.) as well as characteristics about the processing units of the NN/DNN environment, a data apportionment sequence can be calculated by the NN/DNN environment components that specifies that input data for each layer is to be apportioned (as well as any associated processing parameters) and communicated between the cooperating NN/DNN memory components and NN/DNN processors to achieve optimal processing. Illustratively, the data apportionment sequence can include a "breadth" only processing sequence, a "depth first" processing sequence, and/or a "dynamic depth first" processing sequence.

Illustratively, a "breadth" only processing sequence describes a processing sequence wherein the partitions of each layer are processed sequentially from a first processing layer to a subsequent processing layer. A "depth first" processing sequence describes a processing sequence wherein a partition from each available processing layer is processed in a preferred sequence. A "dynamic depth" first processing sequence describes a processing sequence wherein the layer data is processed according to a combination of "breadth" only and/or "depth first" processing depending on various NN/DNN characteristics as well as data characteristics. The "dynamic depth" processing sequence can operatively jump between "breadth" only and "depth first" processing as environment and/or data characteristics change.

In an illustrative implementation, the exemplary NN/DD environment can include a local memory component and an external memory component. The local memory components operatively transfer data at higher rates with reduced latency relative to the external memory component. The local memory component can include a size to store smaller amounts of data relative to the external memory component.

In an illustrative operation, input data (e.g., a data blob) can be received for processing by the NN/DNN environment having a specific defined data dimension, associated data processing parameters (e.g., layer weights), defined number of processing layers required for processing, as well as data representative of one or more characteristics of the cooperating memory components of the NN/DNN environment. Operatively, the exemplary operational controller or other cooperating NN/DNN component (e.g., online/offline compiler, etc.) provides instructions to calculate a data apportionment sequence using, the received data dimensions, cooperating memory characteristics, and number of layers. In the illustrative implementation, the calculated data apportionment sequence generates data representative of the number of portions to parcel the input data across each of the available processing layers and specify the timing of loading of the portions of data (and their associated processing parameters) from an exemplary external memory component to an internal memory component to an available processing unit of the NN/DNN environment.

Additionally, the calculated data apportionment sequence includes instructions for the operational controller to communicate the data portion(s) from the exemplary external memory to the local memory to the available processing unit(s) according to a calculated sequence. Illustratively, the exemplary local memory component can be utilized in the processing sequence to store output data for processed portions of data for each of the layers. In the illustrative operation, upon processing all of the portions of a given processing layer and storing such output data in a local memory, the cooperating processing units can assemble the generated output portion data for the given processing layer (stored in the exemplary local memory) to generate complete output data for the given processing layer. In an illustrative operation, the generated complete layer output data can then be stored in the exemplary external memory component that results in making more of the exemplary local memory component's memory available for subsequent processing.

It should be appreciated that, although described in relation to a system, the above-described subject matter may also be implemented as a computer-controlled apparatus, a computer process, a computing system, or as an article of manufacture such as a computer-readable medium and/or dedicated chipset.

Neural Networks Background:

In artificial neural networks, a neuron is the base unit used to model a biological neuron in the brain. The model of an artificial neuron can include the inner product of an input vector with a weight vector added to a bias, with a non-linearity applied. Comparatively, a neuron, in an exemplary DNN module, (e.g., 105 of FIG. 1) is closely mapped to an artificial neuron.

Illustratively, the DNN module can be considered a super-scalar processor. Operatively, it can dispatch one or more instructions to multiple execution units called neurons. The execution units can be "simultaneous dispatch simultaneous complete" where each execution unit is synchronized with all of the others. A DNN module can be classified as a SIMD (single instruction stream, multiple data stream) architecture.

Turning to exemplary DNN environment 100 of FIG. 1, DNN module 105 has a memory subsystem with a unique L1 and L2 caching structure. These are not traditional caches, but are designed specifically for neural processing. For convenience, these caching structures have adopted names that reflect their intended purpose. By way of example, the L2 cache 125(A) can illustratively maintain a one megabyte (1 MB) storage capacity with a high speed private interface operating at 16 GBps. The L1 cache can maintain an 128 KB storage capacity split between kernel and activation data. The L1 cache can be referred to as Line Buffer, and the L2 cache is referred to as BaSRAM.

The DNN module can be a recall-only neural network and programmatically support a wide variety of network structures. Training for the network can be performed offline in a server farm or data center; the DNN module does not perform any training functions. The result of training is a set of parameters that can be known as either weights or kernels. These parameters represent a transform function that can be applied to an input with the result being a classification or semantically labeled output.

In an illustrative operation, the DNN module can accept planar data as input. Input is not limited to image data only, as long as the data presented is in a uniform planar format the DNN can operate on it.

The DNN module operates on a list of layer descriptors which correspond to the layers of a neural network. Illustratively, the list of layer descriptors can be treated by the DNN module as instructions. These descriptors can be pre-fetched from memory into the DNN module and executed in order.

Generally, there can be two main classes of layer descriptors: 1) Memory-to-memory move descriptors, and 2) Operation descriptors. Memory-to-memory move descriptors can be used to move data to/from the main memory to/from a local cache for consumption by the operation descriptors. Memory-to-memory move descriptors follow a different execution pipeline than the operation descriptors. The target pipeline for memory-to-memory move descriptors can be the internal DMA engine, whereas the target pipeline for the operation descriptors can be the neuron processing elements. Operation descriptors are capable of many different layer operations.

The output of the DNN is also a blob of data. The output can optionally be streamed to a local cache or streamed to main memory. The DNN module can pre-fetch data as far ahead as the software will allow. Software can control pre-fetching by using fencing and setting dependencies between descriptors. Descriptors that have dependency sets are prevented from making forward progress until the dependency has been satisfied.

Turning now to FIG. 1, an exemplary neural network environment 100 can comprise various cooperating components inclusive of DNN module 105, cache memory 125 and 125(A), low bandwidth fabric 110, bridge component 115, high bandwidth fabric 120, SOC 130, PCIE "End Point" 135, Tensilica Node 140, memory controller 145, LPDDR4 memory 105, and an input data source 102. Further, as is shown, DNN module 105 can also comprise a number of components comprising prefetch 105(A), DMA 105(B), Register Interface 105(D), load/store unit 105(C), layer controller 105(G), save/restore component 105(E), and neurons 105(F). Operatively, an exemplary DNN environment 100 can process data according to a selected specification wherein the DNN module performs one or more functions as described herein.

Figure 2:
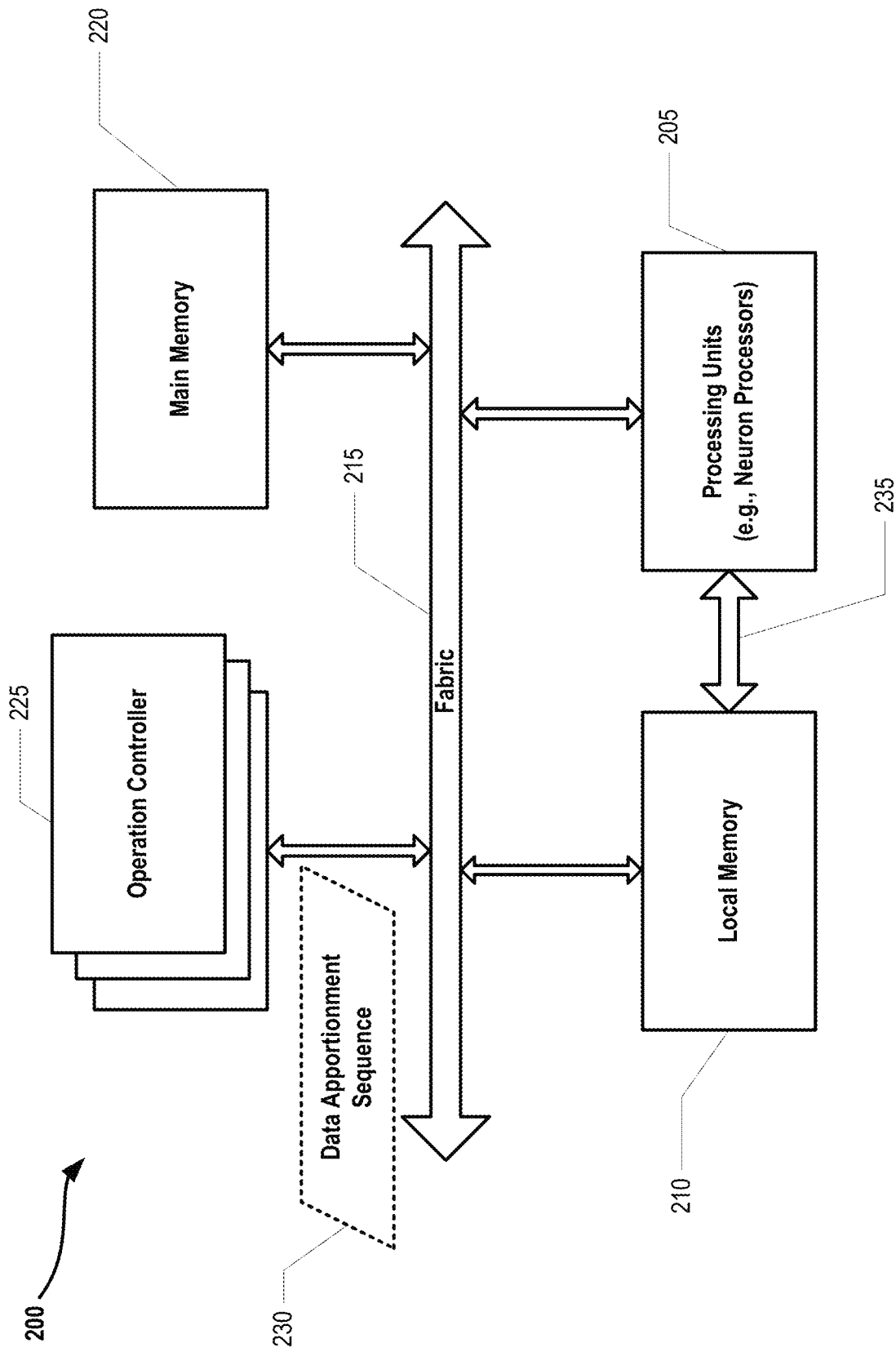
FIG. 2 illustrates a block diagram of an exemplary neural network environment deploying the data apportionment sequence in accordance with the herein described systems and methods.

FIG. 2 illustrates an exemplary neural network environment 200 operable to calculate and execute an exemplary data apportionment sequence in accordance with the herein described systems and methods. As is shown, the exemplary neural network environment 200 comprises one or more operation controllers 225 that provide one or more commands for execution. The one or more operation controllers 225 can operate to generate instructions (e.g., data apportionment sequence 230) that are communicated through fabric 215 to cooperating memory component local memory 210 as well as one or more processing units 205 (e.g., neuron processors). Further, as is shown in FIG. 2, data can be operatively retrieved and stored in main memory component 220 by processing units 205 through the fabric 215. In some embodiments, data can be stored from processing units 205 to local memory 210 through a local fabric 235. In an illustrative implementation, a neural network environment fabric can be a data bus capable of accepting and communicating through various data to one or more cooperating components.

Figure 6:
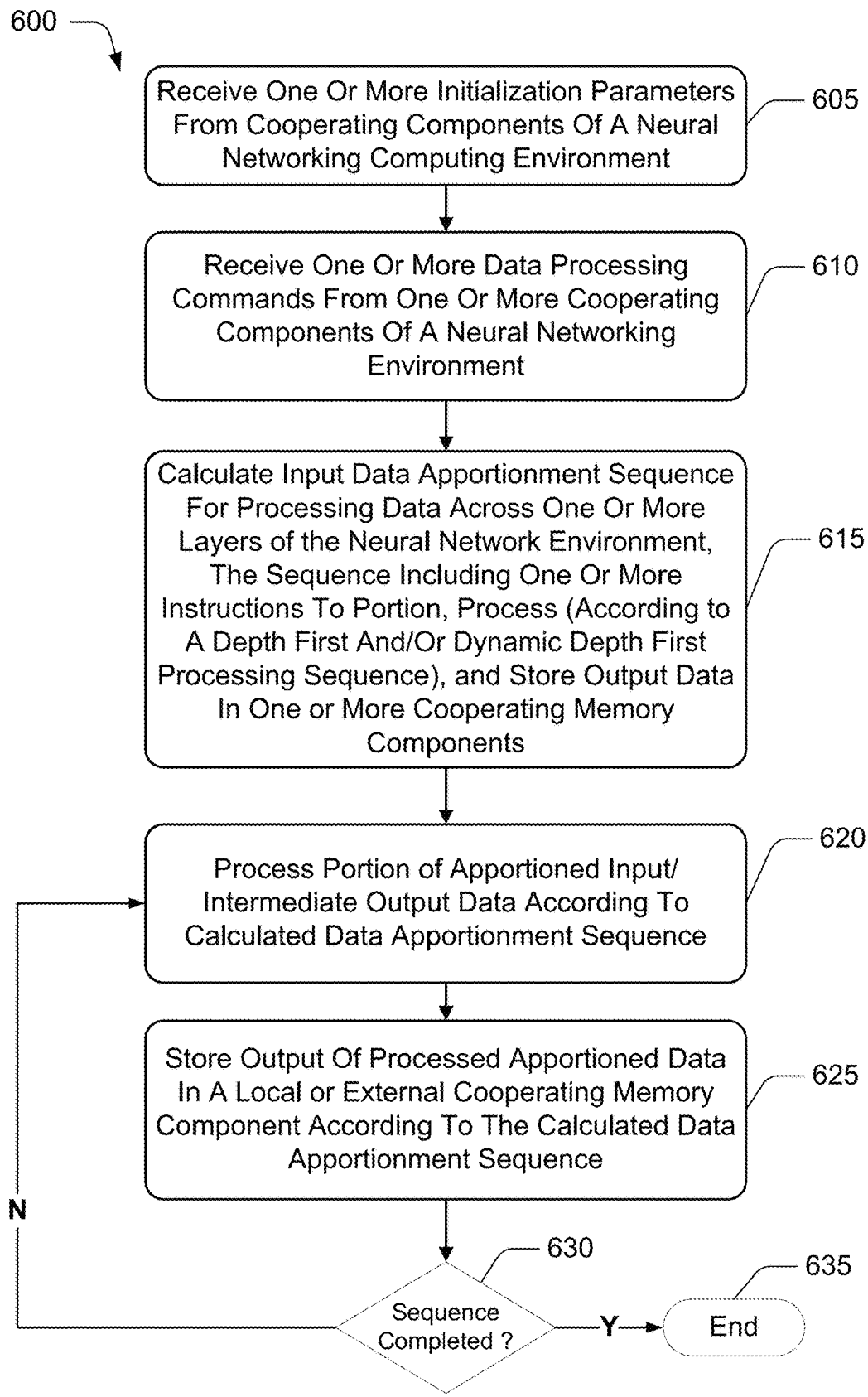
FIG. 6 is a flow diagram of an illustrative process to allow for a depth first processing of data in an exemplary neural network environment.
Figure 7:
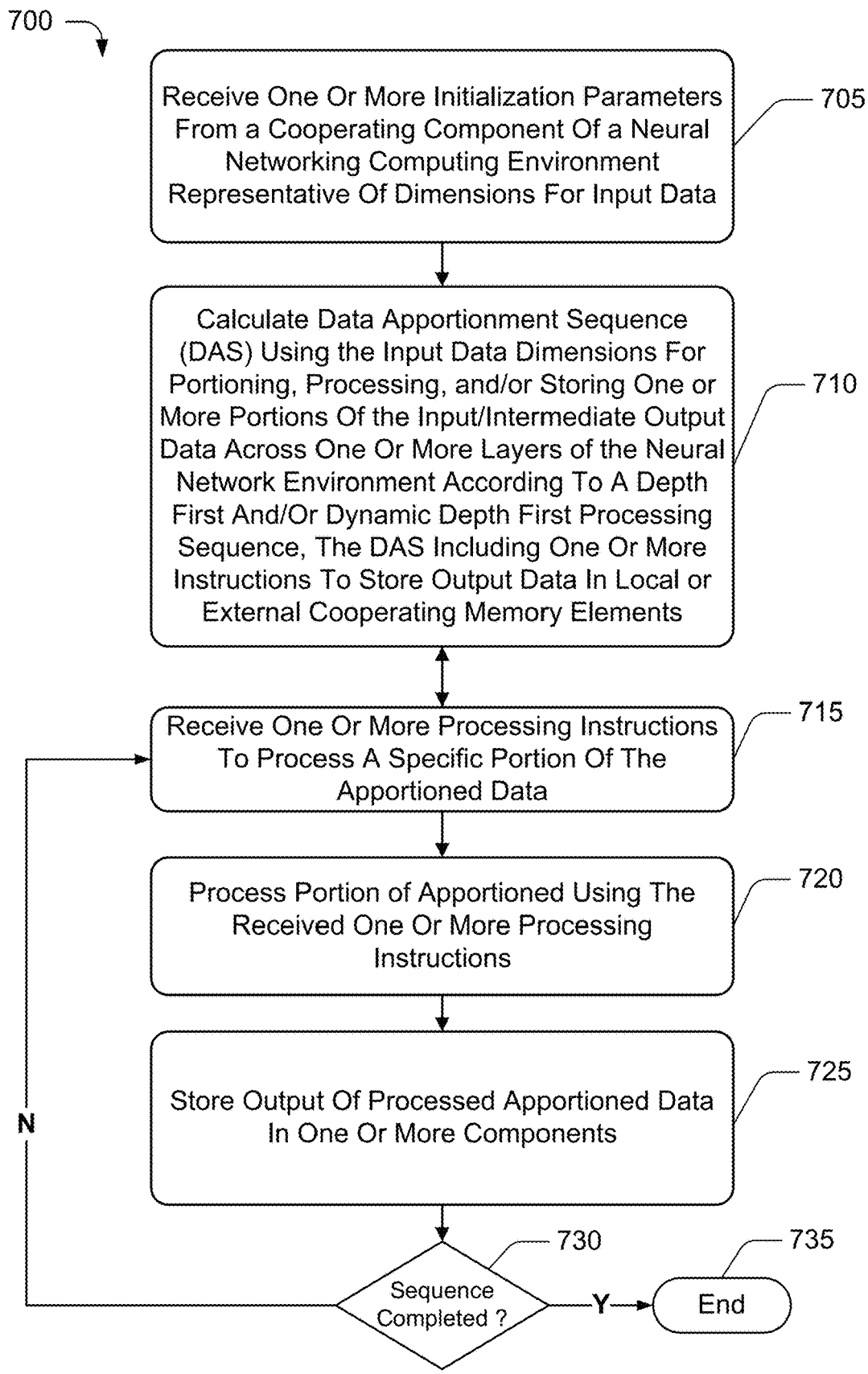
FIG. 7 is a flow diagram of an illustrative depth first processing of layers of an exemplary neural network environment.

In the illustrative operation, the exemplary neural network environment 200 can operatively process data according to the process described in FIGS. 6 and 7. Specific to the components described in FIG. 2, these components are merely illustrative, as one of ordinary skill in the art would appreciate the processing described in FIGS. 6 and 7 to be performed by other components than those illustrated in FIG. 2.

Figure 3:
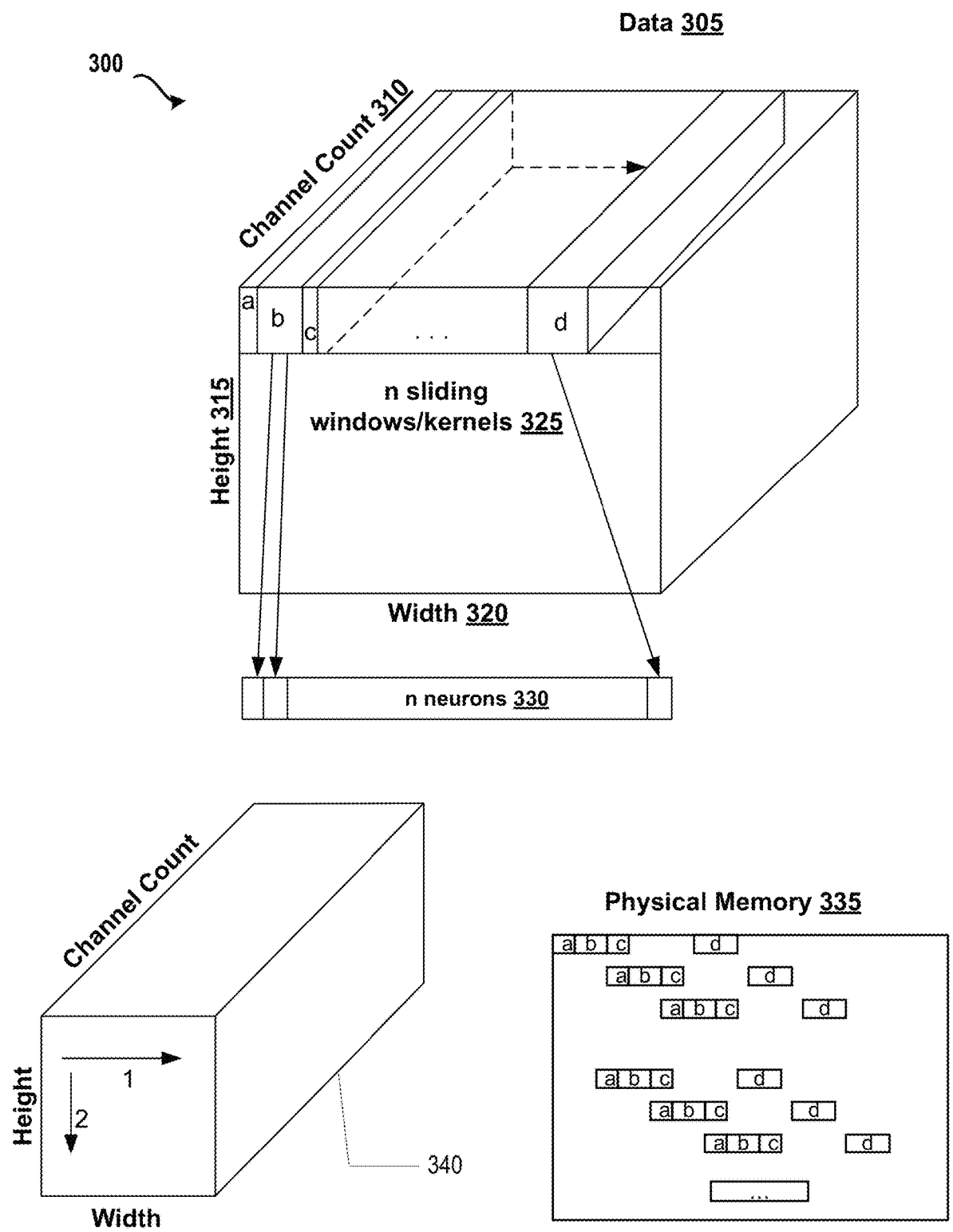
FIG. 3 illustrates a block diagram of exemplary input data represented in an illustrative logical data mapping according to the herein described systems and methods.

FIG. 3 illustrates an example logical data mapping 300 for exemplary input data. As is shown, data 305 can be represented as data having a certain dimension and volume 340 comprising channel count 310, height 315, and width 320. According to the herein described systems and methods, data 305 can be portioned and prepared for processing by cooperating n neurons 330 such that first portion can be communicated to a first neuron, second portion b can be communicated to a second neuron, and so forth until n portions are communicated to n neurons.

In an illustrative operation, the portions of data 305 can be determined using n sliding window/kernels 325 based on one or more instructions provided by a cooperating controller component of an exemplary neural network environment (e.g., 200 of FIG. 2). Further as is shown, the input data portions a, b, c, and d can be addressed to a physical memory 325 using one or more initialization parameters provided by a cooperating operation controller component of an exemplary neural network environment (e.g., 200 of FIG. 2).

Figure 4:
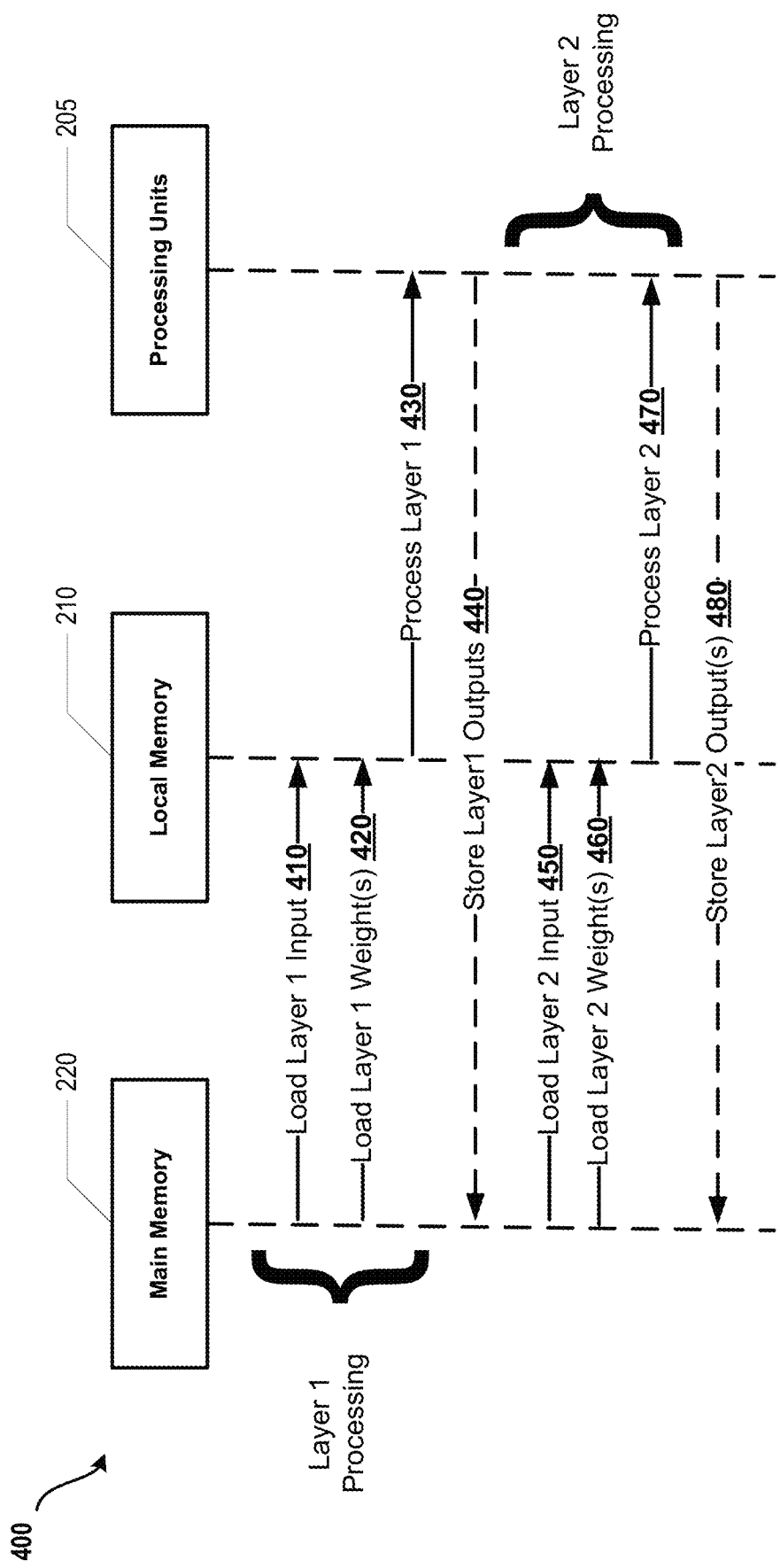
FIG. 4 illustrates a block diagram of an exemplary block sequence diagram for exemplary input data processed according to an illustrative apportionment sequence in accordance with the herein described systems and methods.

FIG. 4 illustrates an exemplary data state model and exemplary data processing sequence of exemplary neural network environment 400. As is shown, neural network environment 400 can include a main memory component 220, local memory component 210, and processing units 205 (as are shown in FIG. 2). Operatively, data can be directly loaded from main memory 220 to local memory 210 such that an exemplary first layer input data layer 1 input 410 is loaded from main memory 220 to local memory 210. Additionally, the layer 1 weights 420 (e.g., processing parameters associated with layer 1 input 410) can also be loaded from main memory 220 to local memory 210. As is shown in FIG. 1, the layer 1 input and layer 1 weights can then be communicated to processing units 205 for processing by process layer 1 430. Operatively, processing units 205 can process layer 1 input data 410 and layer 1 weights 420 to generate output data (not shown) that then can be stored as layer 1 outputs 440 to main memory 220. This sequence comprises the complete layer one processing.

Further, as is shown in FIG. 4, layer 2 input data 450 and its associated layer 2 weights 460 can be loaded from main memory 220 to local memory 210. Operatively, layer 2 input data 450 and layer 2 weights 460 can then be communicated from local memory 210 to processing units 205 for processing. In an illustrative operation, processing unit 205 can process layer 2 input data 450 and layer 2 weights 460 to at stepwise processing sequence step 470 to generate layer 2 output data 480 for storage on main memory 220.

In an illustrative operation, the generated layer 1 output data store on main memory by sequence step 440 can be layer 2 input data 450. Such sequential layer processing wherein the output of the previous processing layer can act as input to a subsequent processing layer is typical of conventional deep neural network environment processing protocols. The exemplary data processing sequence of FIG. 4 relies on each layer input data being fully processed prior to the subsequent layer input data being processed by the processing units 205 of the exemplary neural network environment 400.

For exemplary purposes only, FIG. 4 depicts exemplary neural network environment 400 including two processing layers having main memory component 220, local memory component 210, and processing units 205 in a particular cooperating configuration. One of ordinary skill will appreciate that such depiction is merely illustrative as the inventive concepts described by the herein described systems and methods contemplate operations for neural network environments having various processing layers and supporting various cooperating configurations between the main memory 220 component, local memory component, and processing units 205.

Figure 5A:
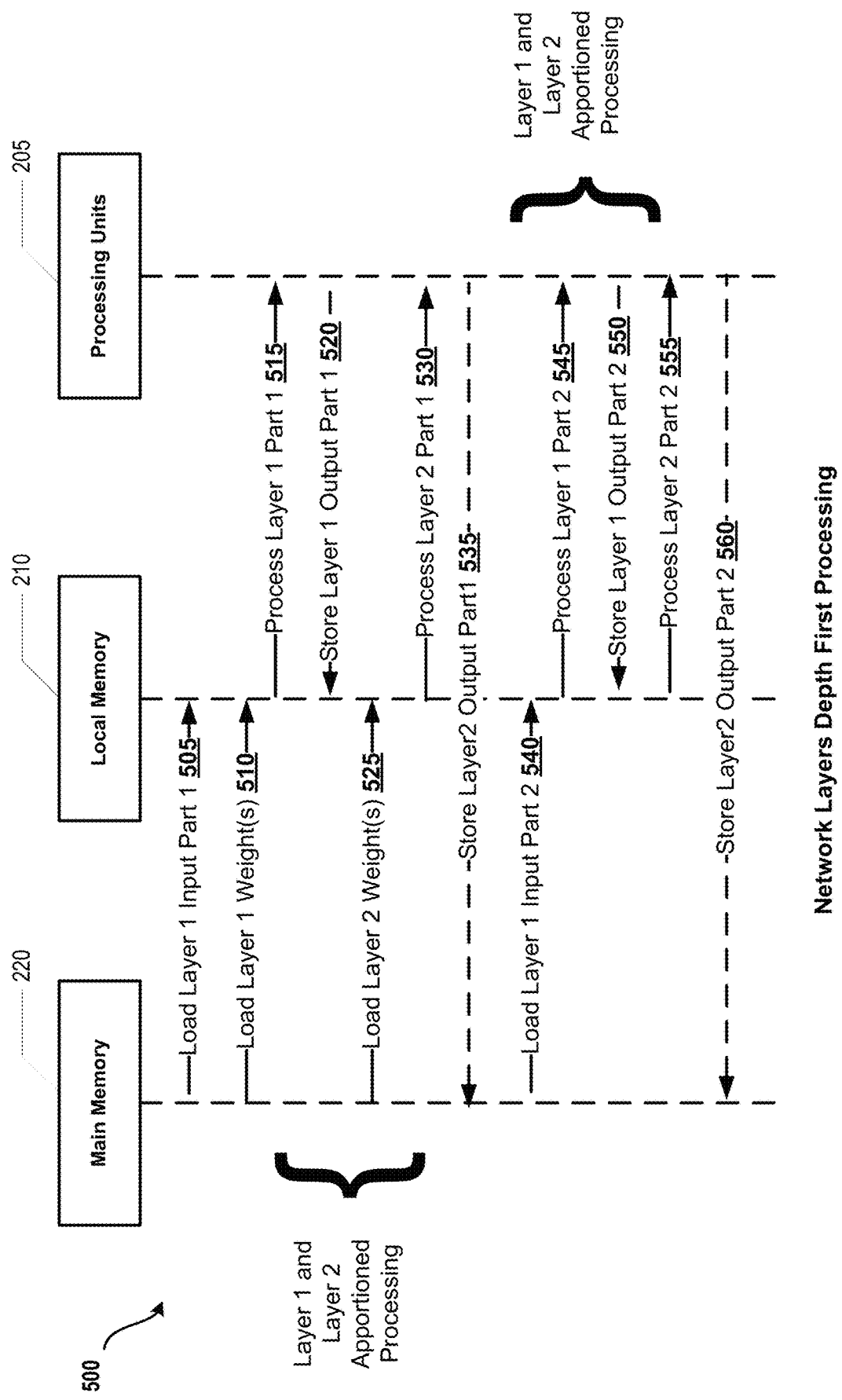
FIG. 5A illustrates a block sequence diagram of an exemplary stepwise processing sequence for exemplary input data processed according to another illustrative apportionment sequence in accordance with the herein described systems and methods.

FIG. 5A illustrates another exemplary data stepwise sequence processing model of exemplary network environment 500. As is shown, exemplary network environment 500 can include main memory component 220, local memory component 210, and processing units 205 (as are shown in FIG. 2). By way of illustration only, the exemplary neural network environment is depicted as supporting two processing layers. In this illustration, one or more neural network environment 500 components (not shown) (e.g., operational controller(s) 225) can calculate a data apportionment sequence for the completed input data of layer 1 (not shown). The data apportionment sequence can be calculated using various characteristics of layer 1 input data (e.g., data dimensions), as well as various characteristics of the main memory and local memory components (e.g., memory size, memory latency, memory location, etc.), and the number of processing layers available in the neural network environment (e.g., in this illustration—two layers).

Operatively, the calculated apportionment sequence can include instructions executable by one or more components of exemplary neural network environment 500 (e.g., DNN module 105 of FIG. 1) to portion the input data for each of the layers as well as the associated processing parameters for each input data layer portion into optimal data portion sizes that when processed by exemplary neural network environment 500 would optimize the utility of the one or more cooperating memory components (e.g., 220, 210) during a processing cycle. Additionally, in an illustrative operation, the calculated apportionment sequence can include a stepwise processing sequence in which the apportioned input layer data is communicated between/processed by, in discrete steps, the cooperating memory components (220 and 210) as well as processing units 205. Furthermore, the exemplary calculated apportionment sequence can include instructions to store intermediate output layer data in local memory according to the provided stepwise processing sequence.

FIG. 5A shows the processing of input data in an exemplary neural network environment having two processing layers that supports a local memory component 210, main memory component 220, and one or more processing units 205. Illustratively, the input data can be apportioned according to an exemplary calculated data apportionment sequence to include a layer 1 part 1 portion (and associated layer 1 weights), layer 1 part 2 portion, and layer 2 weights. Additionally, in the illustrative implementation, an exemplary calculated apportionment sequence can include instructions regarding when such portions of data that have been apportioned are loaded between the available memory components (local memory 210 and main memory 220) and the processing units 205 (e.g., exemplary stepwise processing sequence). Intermediate layer output data storage in local memory 210 according the exemplary stepwise processing sequence can also be managed by one or more instructions found in the calculated apportionment sequence.

According to an exemplary calculated apportionment sequence (not shown) layer 1 input part 1 (i.e., apportioned according to the exemplary apportionment sequence) can be loaded from main memory component 220 to local memory component 210 at stepwise processing sequence step 505. Additionally, layer 1 weights (e.g., processing parameters for layer 1 part 1 input data 505), can be loaded from main memory component 220 to local memory component 210 at stepwise processing sequence step 510. Processing units 205 can process layer 1 part 1 input data and layer 1 weights according to stepwise processing sequence step 515 to generate and store layer 1 part 1 output data at stepwise processing sequence step 520. Processing proceeds along the stepwise processing sequence to step 525 where layer 2 weights are loaded from main memory 220 to local memory 210 to allow for the processing of layer 2, part 1 input data (i.e., as described herein, the output of a given processing layer can act as the input of a subsequent layer in which, in this illustrative implementation, the output of layer 1 is the input data for layer 2) by processing units 205 at stepwise processing sequence step 530. The layer 2, part 1 output data can then be stored in main memory 220 at stepwise processing sequence step 535.

Operatively, the remaining portion of layer 1 input data (i.e., layer 1 part 2 input data) is then loaded from main memory 220 to local memory 210 at stepwise processing sequence step 540 and processed at stepwise processing sequence step 545 to generate layer 1 part 2 output data which is then stored in local memory 210 at stepwise processing step 550. The remaining input data portion of layer 2 (i.e., layer 2 portion 2 is also layer 1 part 2 output data) is then loaded from local memory 210 for processing by processing units 205 at stepwise processing sequence step 555. Layer 2 part 2 output data is generated for storage into main memory 220 at stepwise processing sequence step 560 and completes the generation of the complete output data set by exemplary neural network environment 500 for the originally received input data of the illustrative implementation (i.e., since there are no more processing layers, layer 2 part 1 output data and layer 2 part 2 output data store in main memory can represent that totality of the output data to be generated by exemplary neural network environment 500 for the originally received input data).

For exemplary purposes, only, FIG. 5A depicts exemplary neural network environment 500 including two processing layers having main memory component 220, local memory component 210, and processing units 205 in a particular cooperating configuration. One of ordinary skill will appreciate that this depiction is merely illustrative as the inventive concepts described by the herein described systems and methods contemplate operations for neural network environments having various processing layers and supporting various cooperating configurations between the main memory 220 component, local memory component 210, and processing units 205 as well as various stepwise processing sequences that can differ based on the characteristics of the components of exemplary neural network environment 500.

Figure 5B:
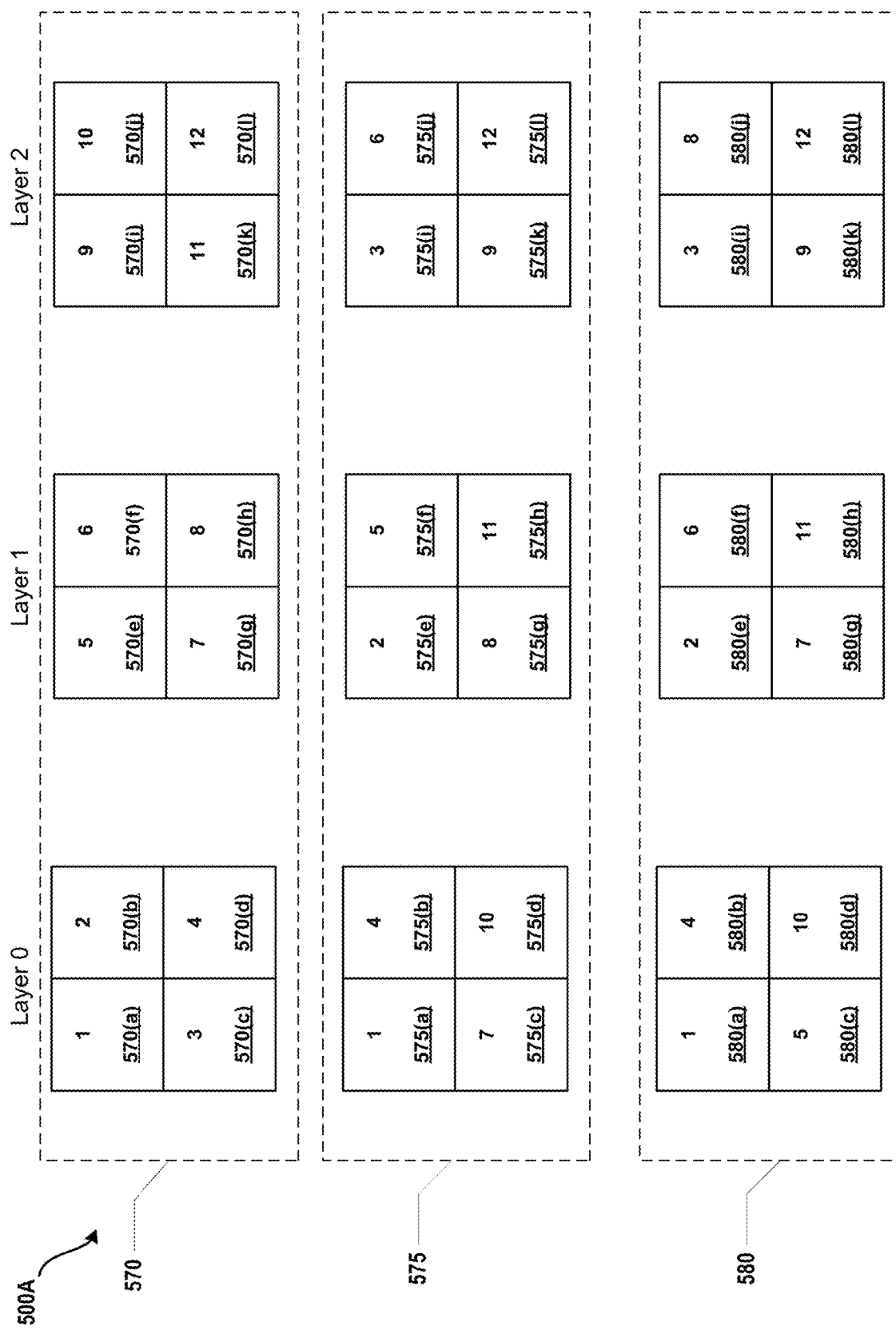
FIG. 5B illustrates exemplary processing sequences for various processing sequences in accordance with the herein described systems and methods.

FIG. 5B is a block diagram showing exemplary processing sequences 570, 575, and 580 of an exemplary neural network environment 500A. As is shown, processing sequence 570 can to process partitions (570(a), 570(b), 570(c), 570(d), 570(e), 570(f), 570(g), 570(h), 570(i), 570(j), 570(k), and 570(k)—for the sake of simplicity to be referred to hereafter as 570(a)-570(l))) of data from available processing layers (Layer 0, Layer 1, and Layer 2). In this processing sequence, the data partitions (570(a)-570(l)) are processed in sequential order (as indicated by the processing sequence steps 1-12) (e.g., Layer 0; 1-4, Layer 1; 5-8, and Layer 2; 9-12) such that the data partitions of Layer 0 (i.e., 570(a), 570(b), 570(c), and 570(d) are first processed, then the data partitions of Layer 1 (i.e., 570(e), 570(f), 570(g), and 570(h)), then the data partitions of Layer 2 (i.e., 570(i), 570(j), 570(k), and 570(l)). This type of processing sequence can be considered a "breadth" only processing sequence.

Further, as is shown in FIG. 5B, exemplary NN/DNN environment can also execute processing sequence 575. In this processing sequence, a data partition from each layer is processed in sequence (i.e., 1—(575(a), 2—575(e), 3—575(i)), then a second data partition from each layer is processed in sequence (i.e., 4—(575(b), 5—575(f), 6—575(j)) until all data partitions are processed across the layers. This type of processing sequence can be considered a "depth first" processing sequence.

Further as is shown in FIG. 5B, exemplary NN/DNN environment can also execute processing sequence 580. In this processing sequence, data partitions (580(a), 580(b), 580(c), 580(d), 580€, 580(f), 580(g), 580(h), 580(i), 580(j), 580(k), and 580(l)) can be processed according to "breadth" only and/or "depth first" processing sequence such that, in an illustrative operation, data partitions from each layer can be processed sequentially (e.g., 1—580(a), 2—580(e), 3—(580(i)) according to a "depth first" processing sequence, and then data from a single partition can be processed (4—580(b), 5—580(c), then 6—580(f), 7—580(g), and then 8—(580(j), 9—580(k)) according to a "breadth" only processing sequence, and then data from each partition can be processed (10—580(d), 11—580(h), 12—580(l)) according to a "depth first" processing sequence. Accordingly, the "dynamic depth first" processing sequence can operatively allow for the processing of the layer partitions through an exemplary interleaving operation to switch from a "breadth" only to a "depth first" processing sequence as the data and environment characteristics dictate. The "dynamic depth first" processing sequence can provide additional robustness to optimize performance and memory usage depending on the environment and/or data characteristics.

It is appreciated that the exemplary processing sequences illustrated in FIG. 5B are merely illustrative, as the inventive concepts described herein can utilize other processing sequences that operatively optimize performance and/or memory utilization for exemplary NN/DNN environments. Additionally, although the size of the partitions are shown as being of equal size, the inventive concepts described herein contemplate data partitions of varying sizes.

FIG. 6 is a flow diagram of an illustrative process 600 to enhance performance of a neural network environment using a depth first approach to data processing. It should be understood that the operations of the processes disclosed herein are not necessarily presented in any particular order and that performance of some or all of the operations in an alternative order(s) is possible and is contemplated. The operations have been presented in the demonstrated order for ease of description and illustration. Operations may be added, omitted, and/or performed simultaneously, without departing from the scope of the appended claims.

It also should be understood that the illustrated processes (also referred to as "methods" or "routines") can end at any time and need not be performed in its entirety. Some or all operations of the methods, and/or substantially equivalent operations, can be performed by execution of computer-readable instructions included on a computer-storage media, as defined below. The term "computer-readable instructions," and variants thereof, as used in the description and claims, is used expansively herein to include routines, applications, application modules, program modules, programs, components, data structures, algorithms, and the like. Computer-readable instructions can be implemented on various system configurations, including single-processor or multiprocessor systems, minicomputers, mainframe computers, personal computers, hand-held computing devices, microprocessor-based, programmable consumer electronics, combinations thereof, and the like.

Thus, it should be appreciated that the logical operations described herein are implemented (1) as a sequence of computer implemented acts or program modules running on a computing system and/or (2) as interconnected machine logic circuits or circuit modules within the computing system. The implementation is a matter of choice dependent on the performance and other requirements of the computing system. Accordingly, the logical operations described herein are referred to variously as states, operations, structural devices, acts, or modules. These operations, structural devices, acts, and modules may be implemented in software, in firmware, in special purpose digital logic, and any combination thereof.

For example, the operations of the process 600 are described herein as being implemented, at least in part, by the components describe herein and/or components of a remote system. In some configurations, the components described herein or another module running the features disclosed herein can be a dynamically linked library (DLL), a statically linked library, functionality produced by an application programing interface (API), a compiled program, an interpreted program, microcode, machine code, a script or any other executable set of instructions. Data can be stored in a data structure in one or more memory components. Data can be retrieved from the data structure by addressing links or references to the data structure.

Although the following illustration refers to the components of the figures, it can be appreciated that the operations of the routines may be also implemented in many other ways. For example, the process 600 may be implemented, at least in part, by a processor of another remote circuit or a local circuit. In addition, one or more of the operations of the process 600 may alternatively or additionally be implemented, at least in part, by a chipset working alone or in conjunction with other software modules. Any service, circuit or application suitable for providing the techniques disclosed herein can be used in operations described herein.

As is shown, processing begins at block 605 where one or more initialization parameters are received from one or more cooperating components of a neural networking computing environment. Processing then proceeds to block 610 where one more data processing commands are received from one or more cooperating components of a neural networking computing environment. At block 615, an input data apportionment sequence can be calculated that provides a stepwise processing sequence and associated instructions for portioning, processing, and storing one or more of the apportioned data (e.g., input or generated output data) for each layer in one or more cooperating memory components of an exemplary neural network environment according to one or more of "breadth" only, "depth first" and "dynamic depth first" processing sequence. Processing then proceeds to block 620 where a portion of the apportioned input data or generated intermediate output data is processed according to a stepwise processing sequence of the calculated data apportionment sequence of block 615. Processing then proceeds to block 625 where the output of the processed apportioned data can be stored in one or more of the cooperating memory components of the exemplary neural network environment (e.g., in a local or external/main memory component) according to the calculated data apportionment sequence. A check is then performed at block 630 to determine if all of the steps of the stepwise processing sequence have been completed.

If the check at block 630 indicates that there are no additional steps to be processed of the stepwise processing sequence, processing terminates at block 635. However, if the check at block 630 indicates that there are additional steps to be processed of the stepwise processing sequence (e.g., there are more layer portions of data to be processed), processing reverts back to block 620 and proceeds from there.

FIG. 7 is a flow diagram of an illustrative process 700 that utilizes depth first processing to enhance overall processing performance of an exemplary neural network environment. As is shown, processing begins at block 705 where one or more initialization parameters are received from a cooperating component of the neural network environment (e.g., operation controller) wherein the one or more initialization parameters can include data representative of the dimensions for input data, one or more characteristics of one or more memory components of the exemplary neural network environment, and/or the number of processing layers of the exemplary neural network environment. Processing then proceeds to block 710 where an input data apportionment sequence can be calculated using input data dimension data that provides a stepwise processing sequence and associated instructions for portioning, processing, and storing one or more of the apportioned data (e.g., input or generated output data) for each layer in one or more cooperating memory components of an exemplary neural network environment. Processing then proceeds to block 715 where one or more processing instructions are received by one or more cooperating components of the exemplary neural network environment (e.g., processing units/neural processors) to process a specified portion of the apportioned data according to an exemplary stepwise processing sequence (e.g., according to one or more of "breadth" only, "depth first" and "dynamic depth first" processing sequence). Processing then proceeds to block 720 where a specified portion of the apportioned data is processed according to a stepwise processing sequence using the received one or more processing instructions. At block 725, the output of the processed apportioned data is then stored in one or more cooperating memory components (e.g., local memory or external/main memory) according to the exemplary stepwise processing sequence.

A check is then performed at block 730 to determine if the all of the steps of the stepwise processing sequence have been completed. If the check at block 730 indicates that there are no additional steps to be processed of the stepwise processing sequence, processing terminates at block 735. However, if the check at block 730 indicates that there are additional steps to be processed of the stepwise processing sequence (e.g., there are more layer portions of data to be processed), processing reverts back to block 715 and proceeds from there.

Figure 8:
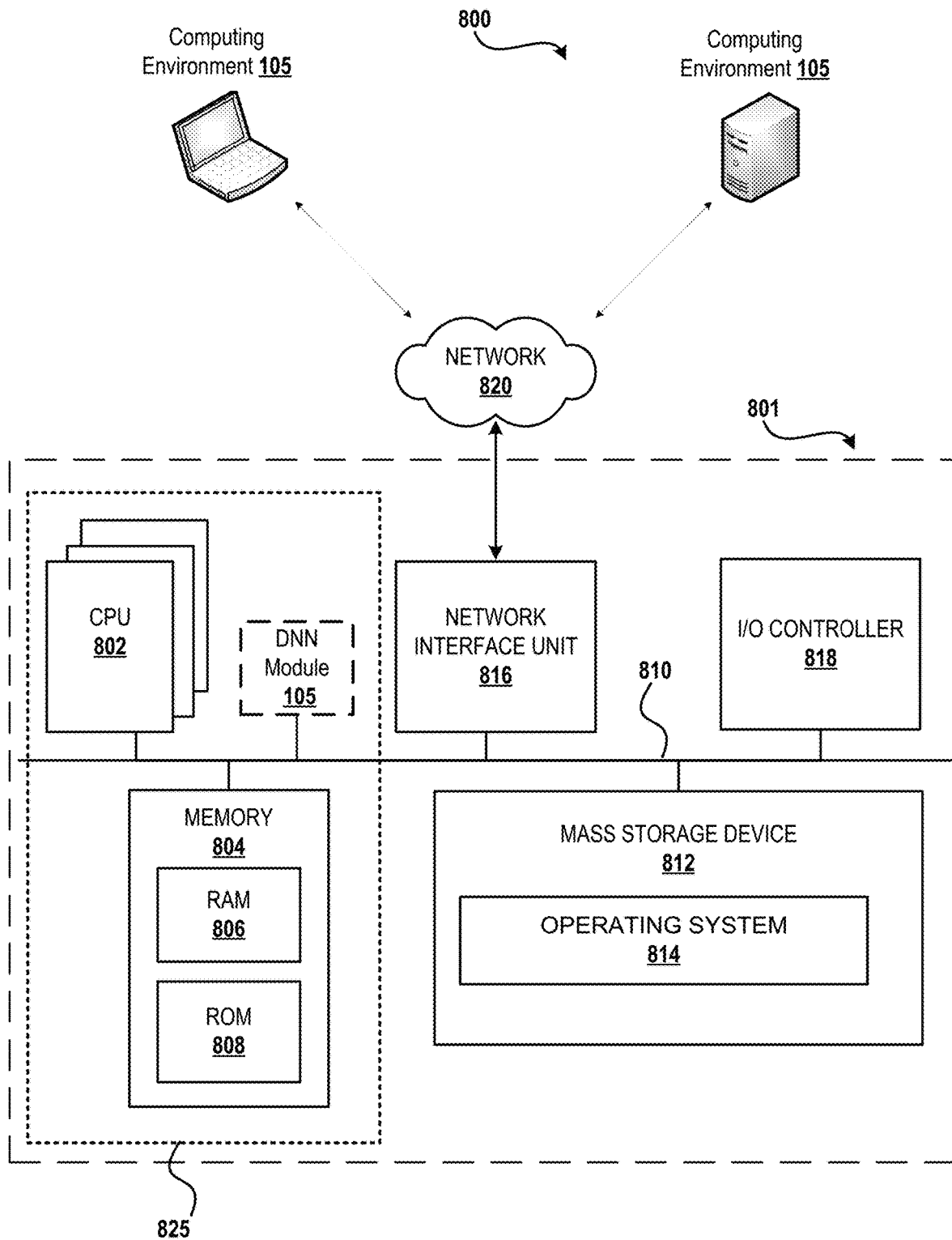
FIG. 8 shows additional details of an illustrative computer architecture for a computer capable of executing the herein described methods.

The computer architecture 800 illustrated in FIG. 8 includes a central processing unit 802 ("CPU"), a system memory 804, including a random-access memory 806 ("RAM") and a read-only memory ("ROM") 808, and a system bus 810 that couples the memory 804 to the CPU 802. A basic input/output system containing the basic routines that help to transfer information between elements within the computer architecture 800, such as during startup, is stored in the ROM 808. The computer architecture 800 further includes a mass storage device 812 for storing an operating system 814, other data, and one or more application programs.

The mass storage device 812 is connected to the CPU 802 through a mass storage controller (not shown) connected to the bus 810. The mass storage device 812 and its associated computer-readable media provide non-volatile storage for the computer architecture 800. Although the description of computer-readable media contained herein refers to a mass storage device, such as a solid-state drive, a hard disk or CD-ROM drive, it should be appreciated by those skilled in the art that computer-readable media can be any available computer storage media or communication media that can be accessed by the computer architecture 800.

Communication media includes computer readable instructions, data structures, program modules, or other data in a modulated data signal such as a carrier wave or other transport mechanism and includes any delivery media. The term "modulated data signal" means a signal that has one or more of its characteristics changed or set in a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

By way of example, and not limitation, computer storage media may include volatile and non-volatile, removable and non-removable media implemented in any method or technology for storage of information such as computer-readable instructions, data structures, program modules or other data. For example, computer media includes, but is not limited to, RAM, ROM, EPROM, EEPROM, flash memory or other solid-state memory technology, CD-ROM, digital versatile disks ("DVD"), HD-DVD, BLU-RAY, or other optical storage, magnetic cassettes, magnetic tape, magnetic disk storage or other magnetic storage devices, or any other medium which can be used to store the desired information and which can be accessed by the computer architecture 800. For purposes of the claims, the phrase "computer storage medium," "computer-readable storage medium" and variations thereof, does not include waves, signals, and/or other transitory and/or intangible communication media, per se.

According to various techniques, the computer architecture 800 may operate in a networked environment using logical connections to remote computers through a network 820 and/or another network (not shown). The computer architecture 800 may connect to the network 820 through a network interface unit 816 connected to the bus 810. It should be appreciated that the network interface unit 816 also may be utilized to connect to other types of networks and remote computer systems. The computer architecture 800 also may include an input/output controller 818 for receiving and processing input from a number of other devices, including a keyboard, mouse, or electronic stylus (not shown in FIG. 8). Similarly, the input/output controller 818 may provide output to a display screen, a printer, or other type of output device (also not shown in FIG. 8). It should also be appreciated that via a connection to the network 820 through a network interface unit 816, the computing architecture may enable DNN module 105 to communicate with the computing environments 100.

It should be appreciated that the software components described herein may, when loaded into the CPU 802 and/or the DNN Module 105 and executed, transform the CPU 802 and/or the DNN Module 105 and the overall computer architecture 800 from a general-purpose computing system into a special-purpose computing system customized to facilitate the functionality presented herein. The CPU 802 and/or the DNN Module 105 may be constructed from any number of transistors or other discrete circuit elements and/or chipsets, which may individually or collectively assume any number of states. More specifically, the CPU 802 and/or the DNN Module 105 may operate as a finite-state machine, in response to executable instructions contained within the software modules disclosed herein. These computer-executable instructions may transform the CPU 802 by specifying how the CPU 802 transitions between states, thereby transforming the transistors or other discrete hardware elements constituting the CPU 802.

Encoding the software modules presented herein also may transform the physical structure of the computer-readable media presented herein. The specific transformation of physical structure may depend on various factors, in different implementations of this description. Examples of such factors may include, but are not limited to, the technology used to implement the computer-readable media, whether the computer-readable media is characterized as primary or secondary storage, and the like. For example, if the computer-readable media is implemented as semiconductor-based memory, the software disclosed herein may be encoded on the computer-readable media by transforming the physical state of the semiconductor memory. For example, the software may transform the state of transistors, capacitors, or other discrete circuit elements constituting the semiconductor memory. The software also may transform the physical state of such components in order to store data thereupon.

As another example, the computer-readable media disclosed herein may be implemented using magnetic or optical technology. In such implementations, the software presented herein may transform the physical state of magnetic or optical media, when the software is encoded therein. These transformations may include altering the magnetic characteristics of particular locations within given magnetic media. These transformations also may include altering the physical features or characteristics of particular locations within given optical media, to change the optical characteristics of those locations. Other transformations of physical media are possible without departing from the scope and spirit of the present description, with the foregoing examples provided only to facilitate this discussion.

In light of the above, it should be appreciated that many types of physical transformations take place in the computer architecture 800 in order to store and execute the software components presented herein. It also should be appreciated that the computer architecture 800 may include other types of computing devices, including hand-held computers, embedded computer systems, personal digital assistants, and other types of computing devices known to those skilled in the art. It is also contemplated that the computer architecture 800 may not include all of the components shown in FIG. 8, may include other components that are not explicitly shown in FIG. 8, or may utilize an architecture completely different than that shown in FIG. 8.

Computing system 800, described above, can be deployed as part of a computer network. In general, the above description for computing environments applies to both server computers and client computers deployed in a network environment.

Figure 9:
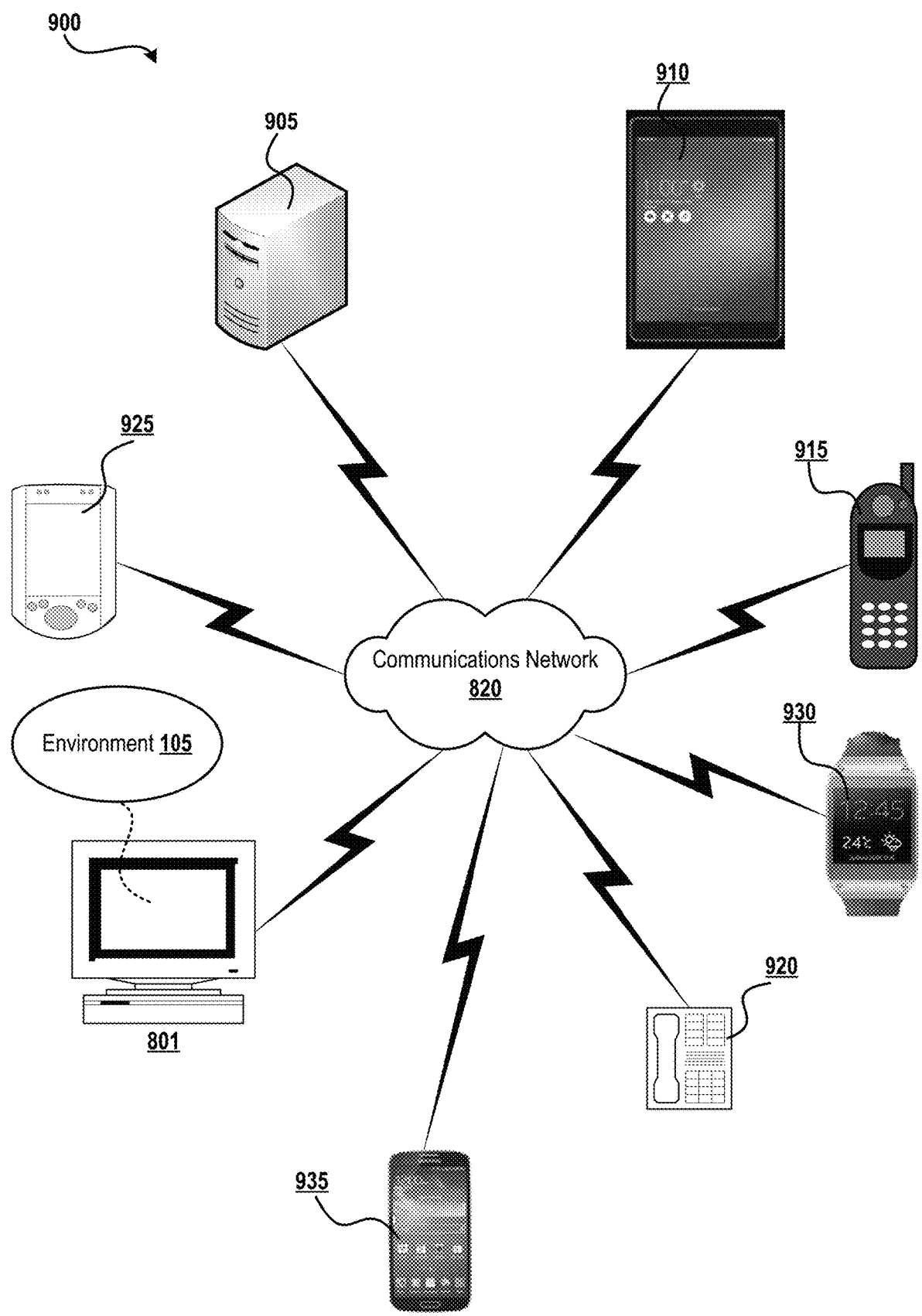
FIG. 9 shows additional details of illustrative computing devices cooperating in accordance with the herein described systems and methods.

FIG. 9 illustrates an exemplary networked computing environment 900, with a server in communication with client computers via a communications network, in which the herein described apparatus and methods may be employed. As shown in FIG. 9, server(s) 905 may be interconnected via a communications network 820 (which may be either of, or a combination of, a fixed-wire or wireless LAN, WAN, intranet, extranet, peer-to-peer network, virtual private network, the Internet, Bluetooth communications network, proprietary low voltage communications network, or other communications network) with a number of client computing environments such as a tablet personal computer 910, a mobile telephone 915, a telephone 920, a personal computer(s) 801, a personal digital assistant 925, a smart phone watch/personal goal tracker (e.g., Apple Watch, Samsung, FitBit, etc.) 930, and a smart phone 935. In a network environment in which the communications network 820 is the Internet, for example, server(s) 905 can be dedicated computing environment servers operable to process and communicate data to and from client computing environments 801, 910, 915, 920, 925, 930, and 935 via any of a number of known protocols, such as, hypertext transfer protocol (HTTP), file transfer protocol (FTP), simple object access protocol (SOAP), or wireless application protocol (WAP). Additionally, the networked computing environment 900 can utilize various data security protocols such as secured socket layer (SSL) or pretty good privacy (PGP). Each of the client computing environments 801, 910, 915, 920, 925, 930, and 935 can be equipped with computing environment 905 operable to support one or more computing applications or terminal sessions such as a web browser (not shown), or other graphical user interface (not shown), or a mobile desktop environment (not shown) to gain access to the server computing environment(s) 905.

Server(s) 905 may be communicatively coupled to other computing environments (not shown) and receive data regarding the participating user's interactions/resource network. In an illustrative operation, a user (not shown) may interact with a computing application running on a client computing environment(s) to obtain desired data and/or computing applications. The data and/or computing applications may be stored on server computing environment(s) 905 and communicated to cooperating users through client computing environments 905, 910, 915, 920, 925, 930, and 935, over an exemplary communications network 820. A participating user (not shown) may request access to specific data and applications housed in whole or in part on server computing environment(s) 905. These data may be communicated between client computing environments 801, 910, 915, 920, 925, 930, 935 and server computing environment(s) 905 for processing and storage. Server computing environment(s) 905 may host computing applications, processes and applets for the generation, authentication, encryption, and communication of data and applications and may cooperate with other server computing environments (not shown), third party service providers (not shown), network attached storage (NAS) and storage area networks (SAN) to realize application/data transactions.

Example Clauses

The disclosure presented herein may be considered in view of the following clauses.

Example Clause A, a system for enhanced data processing in a neural network environment, the system comprising at least one processor, at least one first memory component, and at least one second memory component in communication with the at least one processor, the at least one first and/or second memory components having computer-readable instructions stored thereupon that, when executed by the at least one processor, cause the at least one processor to receive one or more initialization parameters from a cooperating controller component of the neural network environment, the initialization parameters comprising data representative of the dimensions of the data to be processed by the neural network environment, calculate an apportionment sequence for the data, the apportionment sequence comprising one or more instructions to store output data in the at least one first memory component and/or the at least second memory component), the apportionment sequence comprising breadth only, depth first, and dynamic depth first processing sequence, load data from a cooperating memory component of the neural network environment, receive one or more instructions from the cooperating controller component of the neural network environment to process a selected portion of the data according to the calculated apportionment sequence, process the portion of data by one or more cooperating processing units to generate output data for storage on the at least one first memory component or the at least one second memory component, and store the generated output data on the at least one first memory component or the at least one second memory components.

Example Clause B, the system of Example Clause A, wherein the calculated apportionment sequence is based on the number of layers of the neural network environment.

Example Clause C, the system of Example Clause A and B, wherein the computer-readable instructions further cause the at least one processor to load data representative of one or more layer weights for use by one or more processing units (205) of the neural network environment to generate the output data.

Example Clause D, the system of Example Clauses A through C, wherein the computer-readable instructions further cause the at least one processor to store the generated output data in the at least one first memory component.

Example Clause E, the system of Example Clauses A through D, wherein the computer-readable instructions further cause the at least one processor to store the generated output data in the at least one second memory component.

Example Clause F, the system of Example Clauses A through E, wherein the computer-readable instructions further cause the at least one processor to calculates the apportionment sequence based on the size of the at least first memory component and/or the size of the at least second memory component.

Example Clause G, the system of Example Clauses A through F, wherein the computer-readable instructions further cause the at least one processor to store the generated output data in the at least first memory component.

Example Clause H, the system of Example Clauses A through G, wherein the computer-readable instructions further cause the at least one processor to store the generate output data in the at least second memory component.

Example Clause I, a computer-implemented method, comprising: receiving one or more initialization parameters from a cooperating controller component, the initialization parameters comprising data representative of the dimensions of input data and data representative of the number of processing layers associated with the input data, calculating an apportionment sequence for the input data, the apportionment sequence comprising one or more instructions to store output data in at least one first memory component and/or at least one second memory component and comprising one or more instructions to load associated data required to process the input data), the apportionment sequence comprising breadth only, depth first, and dynamic depth first processing sequence, load data representative of one or more processing weights from a cooperating memory component, receiving one or more instructions from the cooperating controller component to process a selected portion of the data according to the calculated apportionment sequence, processing the portion of data according to the calculated apportionment sequence by one or more cooperating processing units to generate output data for storage on the at least one first memory component or the at least one second memory component, and storing the generated output data on the at least one first memory component or the at least one second memory components.

Example Clause J, the computer-implemented method of Clause I, further comprising receiving data representative of the size of the at least one first memory component and the size of the at least one second memory component for use in calculating the apportionment sequence.

Example Clause K, the computer-implemented method of Clauses I and J, further comprising storing the generated output data on the at least first memory component.

Example Clause L, the computer-implemented method of Clauses I through K, further comprising storing the generated output data on the at least one second memory component.

Example Clause M, the computer-implemented method of Clauses I through L, further comprising storing a portion of the generated output data on the at least first memory component.

Example Clause N, the computer-implemented method of Clauses I through M, further comprising loading processing weight data associated to the portion of data being processed along the calculated apportionment sequence.

Example Clause O, the computer-implemented method of Clauses I through N, further comprising loading processing weight data associated for the entirety of the input data for each processing layer.

Example Clause P, the computer-implemented method of Clauses I through O, further comprising processing the output data of the previous processing layer as input data to a subsequent processing layer.

Example Clause Q, a computer-readable storage medium having computer-executable instructions stored thereupon which, when executed by one or more processors of a computing device, cause the one or more processors of the computing device to: receive one or more initialization parameters from a cooperating controller component of the neural network environment, the initialization parameters comprising data representative of the dimensions of the data to be processed by the neural network environment, calculate an apportionment sequence for the data, the apportionment sequence comprising one or more instructions to store output data in the at least one first memory component and/or the at least second memory component and load data comprising input data and associated input data parameters between the at least one first memory component and the at least one second memory component), the apportionment sequence comprising breadth only, depth first, and dynamic depth first processing sequence, load data from a cooperating memory component of the neural network environment, receive one or more instructions from the cooperating controller component of the neural network environment to process a selected portion of the data according to the calculated apportionment sequence, process the portion of data by one or more cooperating processing units using the associated input data parameters to generate output data for storage on the at least one first memory component or the at least one second memory component; and store the generated output data on the at least one first memory component or the at least one second memory components according to the calculated apportionment sequence.

Example Clause R, the computer-readable storage medium of Clause Q, wherein the instructions further cause the one or more processors of the computing device to: load data representative of processing weights for the portion of data from an external memory component to a local memory component of the neural network environment according to the calculated apportionment sequence.

Example Clause S, the computer-readable storage medium of Clauses Q and R, wherein the instructions further cause the one or more processors of the computing device to: store the generated output data for the portion of the data in the local memory component according to the calculated apportionment sequence.

Example Clause T, the computer-readable storage medium of Clauses Q through S, wherein the instructions further cause the one or more processors of the computing device to: generate output data for the final processing layer of the neural network environment.

Example Clause U, the computer-readable storage medium of Clauses Q through T, wherein the instructions further cause the one or more processors of the computing device to: store the generated final processing layer output data in the external memory component.

Example Clause V, the computer readable storage medium of Clauses Q through U, wherein the memory component cooperates with a physical sensor capable of producing input data comprising audio data, video data, hepatic sensory data, and other data for subsequent processing by the one or more cooperating processing units\Example Clause W, the computer readable storage medium of Clauses Q through V, wherein the cooperating processing units electronically cooperate with one or more output physical components operative to receive for human interaction processed input data comprising audio data, video data, hepatic sensory data and other data.

CONCLUSION

In closing, although the various techniques have been described in language specific to structural features and/or methodological acts, it is to be understood that the subject matter defined in the appended representations is not necessarily limited to the specific features or acts described. Rather, the specific features and acts are disclosed as example forms of implementing the claimed subject matter.

What is claimed is:

1. A system for enhanced data processing in a neural network environment, the system comprising:
   at least one processor;

at least one first memory component; and at least one second memory component in communication with the at least one processor, the at least one first or second memory component having computer-readable instructions stored thereupon that, when executed by the at least one processor, cause the system to:

receive one or more initialization parameters from a controller component of the neural network environment, the initialization parameters comprising dimensions of data to be processed by the neural network environment;

calculate an apportionment sequence for the data, the apportionment sequence apportioning the data across available processing elements of the neural network environment and scheduled tasks to be performed on the data and associated layer weights, the apportionment sequence comprising a processing sequence that causes processing of layer partitions through an interleaving operation that switches between a breadth only processing sequence and a depth first processing sequence;

load the data from the first or second memory component of the neural network environment;

process a selected portion of the data by one or more processing units to generate output data for storage on the at least one first memory component or the at least one second memory component; and store the generated output data on the at least one first memory component or the at least one second memory component.

2. The system of claim 1, wherein the calculated apportionment sequence is based on a number of layers of the neural network environment.

3. The system of claim 2, wherein the computer-readable instructions further cause the system to load data representative of one or more of the layer weights for use by the one or more processing units of the neural network environment to generate the output data.

4. The system of claim 1, wherein the at least one first memory component is an internal memory component, and the at least one second memory component is an external memory component.

5. The system of claim 1, wherein the apportionment sequence comprises a breadth only, depth first, or dynamic depth first processing sequence.

6. The system of claim 1, wherein the computer-readable instructions further cause the system to calculate the apportionment sequence based on a size of the at least one first memory component or a size of the at least one second memory component.

7. A computer-implemented method, comprising:

receiving one or more initialization parameters from a controller component, the initialization parameters comprising dimensions of input data and number of processing layers associated with the input data;

calculating an apportionment sequence for the input data, the apportionment sequence apportioning the input data across available processing elements and scheduled tasks to be performed on the input data and associated processing weights, the apportionment sequence comprising a processing sequence that causes processing of layer partitions through an interleaving operation that switches, based on the input data, between a breadth only processing sequence and a depth first processing sequence;

load the processing weights from a memory component;

processing a selected portion of the input data according to the calculated apportionment sequence by one or more processing units to generate output data for storage in the memory component; and storing the generated output data on the memory component.

8. The computer-implemented method of claim 7, further comprising receiving data representative of a size of the memory component for use in calculating the apportionment sequence.

9. The computer-implemented method of claim 7, further comprising receiving one or more instructions from the controller component to process a selected portion of the input data according to the calculated apportionment sequence.

10. The computer-implemented method of claim 9, wherein the apportionment sequence comprises a breadth only, depth first, or dynamic depth first processing sequence.

11. The computer-implemented method of claim 9, further comprising processing the output data of a previous processing layer as input data to a subsequent processing layer.

12. The computer-implemented method of claim 7, further comprising loading processing weight data associated with the portion of data being processed along the calculated apportionment sequence.

13. The computer implemented method of claim 7, further comprising loading processing weight data associated with an entirety of the input data for each processing layer.

14. A computer-readable storage medium having computer-executable instructions stored thereupon which, when executed by one or more processors of a computing device, cause the one or more processors of the computing device to:

receive one or more initialization parameters from a controller component of a neural network environment, the initialization parameters comprising dimensions of data to be processed by the neural network environment;

calculate an apportionment sequence for the data, the apportionment sequence apportioning the data across available processing elements of the neural network environment and scheduled tasks to be performed on the data and associated layer weights, the apportionment sequence comprising a processing sequence that causes processing of layer partitions through an interleaving operation that switches between a breadth only processing sequence and a depth first processing sequence;

load the data from a first or second memory component of the neural network environment;

process a selected portion of data by one or more processing units using input data parameters to generate output data for storage on the first memory component or the second memory component; and store the generated output data on the first memory component or the second memory component according to the calculated apportionment sequence.

15. The computer-readable storage medium of claim 14, wherein the instructions further cause the one or more processors of the computing device to:

load data representative of processing weights for the selected portion of data from an external memory component to a local memory component of the neural network environment according to the calculated apportionment sequence.

16. The computer-readable storage medium of claim 14, wherein the instructions further cause the one or more processors of the computing device to:

receive one or more instructions from the controller component to process a selected portion of the input data according to the calculated apportionment sequence.

17. The computer-readable storage medium of claim 16, wherein the apportionment sequence comprises a breadth only, depth first, or dynamic depth first processing sequence.

18. The computer-readable storage medium of claim 14, wherein the instructions further cause the one or more processors of the computing device to:
generate output data for a subsequent processing layer of the neural network environment.

19. The computer readable medium of claim 14, wherein the first memory component or the second memory component cooperates with a physical sensor configured to produce input data comprising audio data, video data, or haptic sensory data for subsequent processing by the one or more processors.

20. The computer readable medium of claim 19, wherein the one or more processors electronically cooperate with one or more output physical components operative to receive for human interaction processed input data comprising audio data, video data, or haptic sensory data.

\* \* \* \* \*